US011092863B2

(12) United States Patent
Chun et al.

(10) Patent No.: US 11,092,863 B2
(45) Date of Patent: Aug. 17, 2021

(54) STORAGE CAPACITOR, DISPLAY DEVICE USING THE SAME AND METHOD FOR MANUFACTURING THE SAME

(71) Applicant: LG Display Co., Ltd., Seoul (KR)

(72) Inventors: Dae-Woong Chun, Paju-si (KR); Woo-Sang Kim, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/654,762

(22) Filed: Oct. 16, 2019

(65) Prior Publication Data

US 2020/0133083 A1 Apr. 30, 2020

(30) Foreign Application Priority Data

Oct. 24, 2018 (KR) .................. 10-2018-0127395

(51) Int. Cl.
*G02F 1/1362* (2006.01)

(52) U.S. Cl.
CPC .. *G02F 1/136213* (2013.01); *G02F 1/136227* (2013.01); *G02F 1/136286* (2013.01)

(58) Field of Classification Search
CPC ......... G02F 1/136213; G02F 1/136259; H01L 21/76894
See application file for complete search history.

(56) References Cited

U.S. PATENT DOCUMENTS

| 5,337,173 | A | 8/1994 | Atsumi et al. |
| 6,046,547 | A | 4/2000 | Nishio et al. |
| 8,664,671 | B2 | 3/2014 | Shirouzu et al. |
| 8,665,251 | B2 | 3/2014 | Shirouzu et al. |
| 8,860,705 | B2 | 10/2014 | Shirouzu |
| 2006/0028592 | A1* | 2/2006 | Lai .................. G02F 1/136259 349/42 |
| 2011/0175885 | A1 | 7/2011 | Shirouzu |
| 2012/0056538 | A1 | 3/2012 | Shirouzu et al. |
| 2012/0326177 | A1 | 12/2012 | Shirouzu et al. |
| 2013/0120230 | A1 | 5/2013 | Chen et al. |
| 2014/0291636 | A1 | 10/2014 | Kim et al. |
| 2015/0097172 | A1 | 4/2015 | Han et al. |
| 2015/0144892 | A1 | 5/2015 | Chang et al. |
| 2020/0258463 | A1* | 8/2020 | Kim ................... G09G 3/3677 |

FOREIGN PATENT DOCUMENTS

| JP | H04-347821 A | 12/1992 |
| JP | H10-232628 A | 9/1998 |
| JP | 2001-330850 A | 11/2001 |
| JP | 2011-034109 A | 2/2011 |
| JP | 2017-198992 A | 11/2017 |
| WO | WO 2010/116626 A1 | 10/2010 |
| WO | WO 2011/141965 A1 | 11/2011 |
| WO | WO 2013/001566 A1 | 1/2013 |

OTHER PUBLICATIONS

Japan Patent Office, Notice of Reasons for Refusal, JP Patent Application No. 2019-192382, dated Dec. 15, 2020, eight pages.

* cited by examiner

*Primary Examiner* — Alia Sabur
(74) *Attorney, Agent, or Firm* — Fenwick & West LLP

(57) ABSTRACT

Disclosed are a storage capacitor, a display device in which the storage capacitor is applied to a gate driver embedded in a substrate and a method for manufacturing the same. Reliability of the display device is improved through change in the configuration of the storage capacitor in the gate driver.

18 Claims, 15 Drawing Sheets

Electrostatic Defect

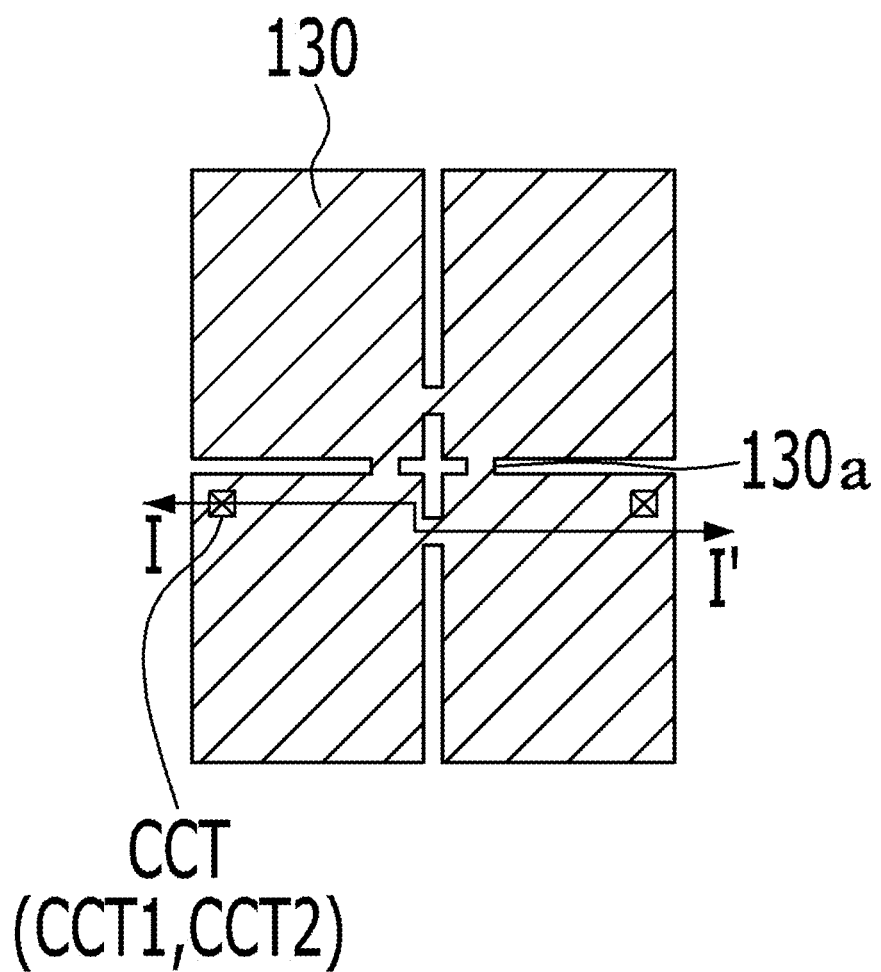

STORAGE CAPACITOR, DISPLAY DEVICE USING THE SAME AND METHOD FOR MANUFACTURING THE SAME

CROSS-REFERENCE TO RELATED APPLICATION

This application claims the benefit of Republic of Korea Patent Application No. 10-2018-0127395, filed on Oct. 24, 2018, which is hereby incorporated by reference in its entirety.

BACKGROUND OF THE DISCLOSURE

Field of the Disclosure

The present disclosure relates to a display device, and more particularly, to a storage capacitor having reliability, a display device using the same which improves reliability of a gate driver embedded in a substrate and a method for manufacturing the same.

Discussion of the Related Art

As we have recently entered the information age, the field of displays which visually display electrical information signals has been rapidly developed and, in order to satisfy such development, various flat display devices having excellent performance, such as thinness, light weight and low power consumption, are being developed and rapidly replacing conventional cathode ray tubes (CRTs).

As examples of flat display devices, there are a liquid crystal display (LCD) device, a plasma display panel (PDP) device, a field emission display (FED) device, an organic light emitting diode (OLED) display device, a quantum dot display device, etc.

There among, self-luminous display devices which do not require separate light sources and achieve compactness and clear color display, such as an organic light emitting diode display device and a quantum dot display device, are considered as competitive applications.

In recent display devices, a method using a gate-in-panel (GIP) in which, in order to simplify the configuration of a circuit unit and omit some of connection processes of pad electrodes in a display device to an external printed circuit board, a circuit having a gate driving function is formed in an edge area, i.e., a non-display area, of a substrate so as to drive gates simultaneously with formation of thin film transistors in respective subpixels in an active area, i.e., a display area, of the substrate is preferred.

Display devices are being manufactured into various types according to user requirements. In particular, the display devices are developed so as to maximize screen sizes thereof or to miniaturize the display devices according to technical development.

In a large-scale display device, since the horizontal length and the vertical length of a panel are increased and thus the lengths of wirings provided in the display device are increased, research to reduce load applied to the wirings so as to reduce luminance deviation according to regions is also being carried out.

Further, according to application of the large-scale display device, change in the configuration of a circuit unit is required and, in this case, defects, such as disconnection, may occur in some devices occupying a large area. Particularly, in a display device to which a GIP part is applied, if a device located at the GIP part is defective, such a defect is observed as a line-type defect.

SUMMARY

Accordingly, the present disclosure is directed to a storage capacitor, a display device using the same and a method for manufacturing the same that substantially obviate one or more problems due to limitations and disadvantages of the related art.

An object of the present disclosure is to provide a display device which improves reliability of a gate driver embedded in a substrate, and a method for manufacturing the same.

Another object of the present disclosure is to provide a large-scale storage capacitor which may prevent an electrostatic defect due to plasma generated during a process through change in the configuration of the storage capacitor.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a storage capacitor includes a plurality of divided metal patterns formed of a first metal layer on a substrate and spaced apart from one another, a first electrode connection pattern formed of a second metal layer, configured to overlap the plurality of divided metal patterns with a buffer layer interposed therebetween and having first connection parts provided in regions between the plurality of divided metal patterns, and a transparent electrode connection pattern configured to overlap the first electrode connection pattern with an interlayer insulating film interposed therebetween, formed of a transparent electrode and having second connection parts provided in regions between the plurality of divided metal patterns non-overlapping the first connection parts.

The storage capacitor may further include first electrode contact patterns formed of the second metal layer to be spaced apart from the first electrode connection pattern, each of the first electrode contact patterns being configured to overlap at least two adjacent divided metal patterns.

The transparent electrode connection pattern may overlap the first electrode contact patterns.

The first electrode contact patterns may pass between the at least two adjacent divided metal patterns.

At least one of the first connection parts and the second connection parts may be used for laser cutting parts in a repair process.

In another aspect of the present disclosure, a display device includes a substrate having an active area having a plurality of subpixels provided therein and a non-display area outside the active area, a plurality of first lines and a plurality of second lines provided in the active area so as to intersect each other, and a storage capacitor including a plurality of divided metal patterns formed of a first metal layer, provided on at least one side of the non-display area to be respectively conductively connected to the first lines and spaced apart from one another, a first electrode connection pattern formed of a second metal layer, configured to overlap the plurality of divided metal patterns with a buffer layer interposed therebetween and having first connection parts provided in regions between the plurality of divided metal patterns, and a transparent electrode connection pattern configured to overlap the first electrode connection pattern with an interlayer insulating film interposed therebetween, formed of a transparent electrode and having second connection parts provided in regions between the plurality of divided metal patterns non-overlapping the first connection parts.

The display device may further include a pull-up transistor and a pull-down transistor arranged in series at one end of each of the first lines, on the at least one side of the non-display area, the end of each of the first lines may be connected between the pull-up transistor and the pull-down transistor, and the storage capacitor may be connected to a gate electrode of the pull-up transistor and the end of each of the first lines.

The display device may further include, in the active area, a light shielding wiring formed in the same layer as the first metal layer, a pixel thin film transistor having a gate electrode, a source electrode, and a drain electrode, formed in the same layer as the second metal layer, and a pixel electrode formed in the same layer as the transparent electrode connection pattern.

The display device may further include an organic light emitting layer and a common electrode sequentially stacked on the pixel electrode, in each of the subpixels in the active area.

In yet another aspect of the present disclosure, a method for manufacturing a display device comprising a storage capacitor includes preparing a substrate having an active area having a plurality of subpixels provided therein and a non-display area outside the active area, forming a plurality of divided metal patterns formed of a first metal layer and spaced apart from one another, on at least one side of the non-display area, forming a buffer layer having first contact holes configured to expose parts of at least two adjacent divided metal patterns, on the substrate, forming first electrode contact patterns configured to connect two adjacent divided metal patterns through the first contact holes and a first electrode connection pattern spaced apart from the first electrode contact patterns and configured to overlap the plurality of divided metal patterns and having first connection parts provided in regions between the plurality of divided metal patterns, by depositing a second metal layer on the buffer layer and then selectively removing the second metal layer, forming an interlayer insulting film having second contact holes configured to overlap the first electrode contact patterns, and forming a transparent electrode connection pattern connected to the first electrode contact patterns through the second contact holes, having second connection parts provided in regions between the plurality of divided metal patterns non-overlapping the first connection parts and configured to overlap the plurality of divided metal patterns, by depositing a transparent metal on the interlayer insulating film and then selectively removing the transparent metal.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 11A to 11C are plan views illustrating a method for manufacturing the display device comprising a storage capacitor in accordance with an embodiment of the present disclosure.

DETAILED DESCRIPTION OF THE DISCLOSURE

Figure 1:
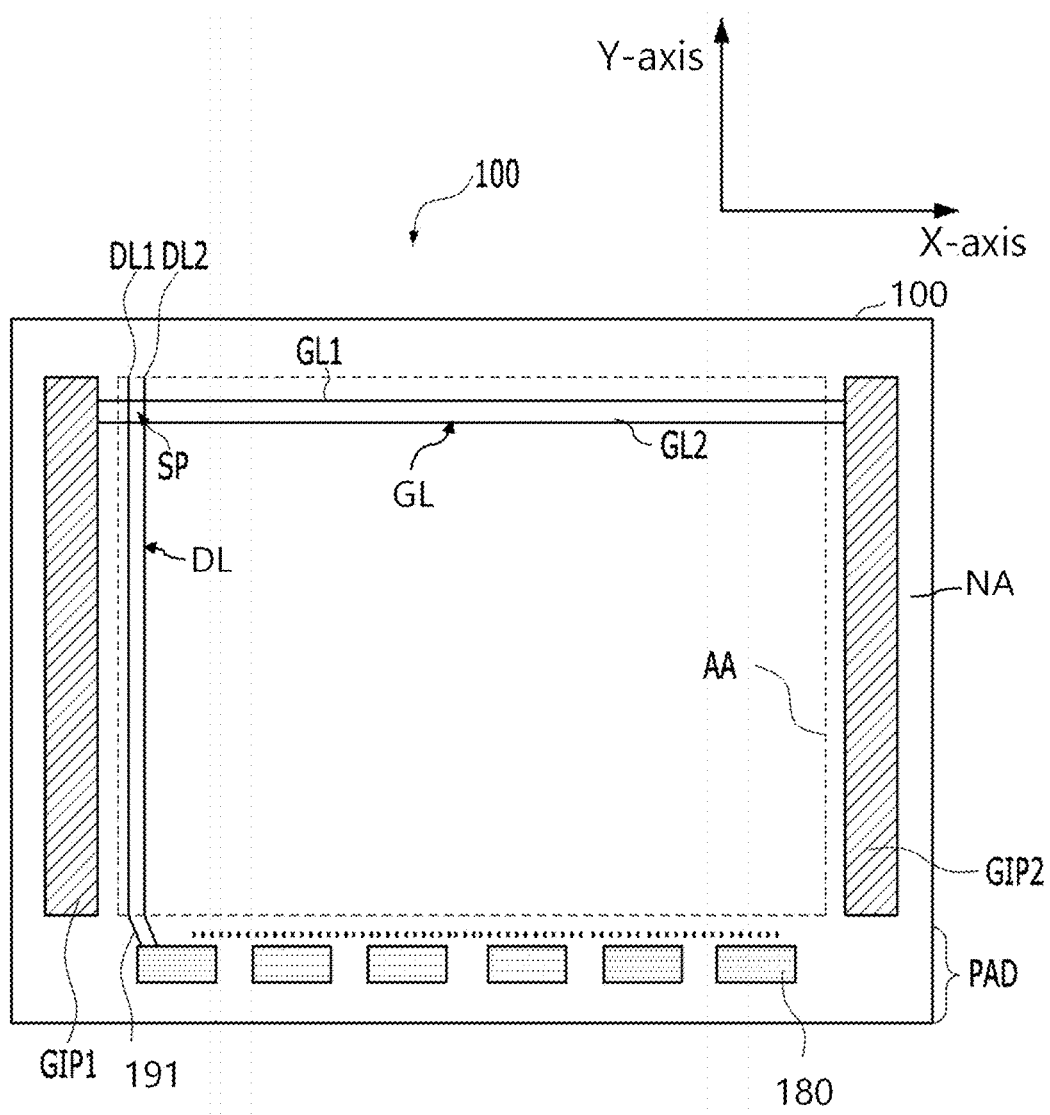
FIG. 1 is a plan view of a display device in accordance with an embodiment of the present disclosure.

Reference will now be made in detail to the preferred embodiments of the present disclosure, examples of which are illustrated in the accompanying drawings. However, the present disclosure may be embodied in many alternative forms and should not be construed as limited to the embodiments set forth herein, and the embodiments of the present disclosure are provided only to completely disclose the disclosure and to completely inform those skilled in the art of the scope of the disclosure. Further, the names of elements used in the following description of the embodiments of the present disclosure are selected in consideration of ease in preparation of the specification, and may thus differ from the names of parts of an actual product.

Shapes, sizes, rates, angles, numbers, etc. disclosed in the drawings to describe the embodiments of the present disclosure are only exemplary and do not limit the present disclosure. In the following description of the embodiments and the drawings, the same or similar elements are denoted by the same reference numerals even though they are depicted in different drawings. In the following description of the embodiments of the present disclosure, a detailed description of known functions and configurations incorporated herein will be omitted when it may make the subject matter of the present disclosure rather unclear. In the following description of the embodiments, the terms 'including', 'having', 'comprising', etc. will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression of an element includes a plural expression of the element unless stated otherwise.

In interpretation of elements included in the various embodiments of the present disclosure, it will be interpreted that the elements include error ranges even if there is no clear statement.

In the following description of the embodiments, it will be understood that, when positional relations are expressed, for example, when an element is 'on', 'above', 'under', 'beside', etc. another element, the two elements may directly contact each other, or one or more other elements may be interposed between the two elements unless the term 'just' or 'directly' is used.

In the following description of the embodiments, it will be understood that, when temporal relations are expressed, for example, a term expressing a sequence of events, such as 'after', 'subsequent to', 'next to' or 'before' may encompass continuous relationship between the events, or discontinuous relationship between the events unless the term 'just' or 'directly' is used.

In the following description of the embodiments, it will be understood that, when the terms 'first', 'second', etc. are used to describe various elements, these terms are used merely to discriminate the same or similar elements. Therefore, an element modified by the term 'first' may be the same as an element modified by the term 'second' within the technical scope of the disclosure unless stated otherwise.

Characteristics of the various embodiments of the present disclosure may be partially or entirely connected to or combined with each other and technically variously driven and interlocked with each other, and the respective embodiments may be independently implemented or be implemented together in connection with each other.

Figure 2:
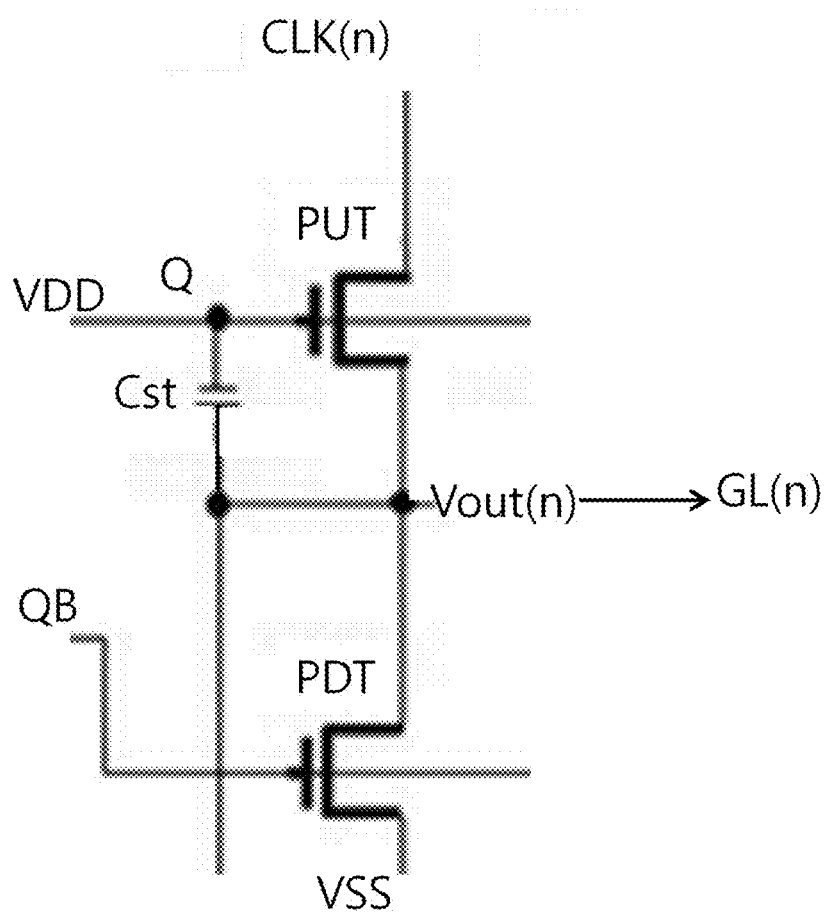
FIG. 2 is a circuit diagram of a gate-in-panel unit connected to adjacent gate lines of FIG. 1 in accordance with an embodiment of the present disclosure.

FIG. 1 is a plan view of a display device in accordance with the present disclosure, and FIG. 2 is a circuit diagram of a gate-in-panel unit connected to adjacent gate lines of FIG. 1.

As exemplarily shown in FIG. 1, the display device in accordance with the present disclosure includes a substrate 100 having an active area AA having a plurality of subpixels provided therein and a non-display area NA outside the active area, a plurality of first lines GL and a plurality of second lines DL intersecting each other in the active area AA, and embedded first gate-in-panel unit GIP1 and the second gate-in-panel unit GIP2 provided on at least one side of the non-display area NA to be conductively connected to the first lines GL and including a stage to sequentially supply a gate driving voltage signal to the first lines GL.

FIG. 1 illustrates a state in which the first gate-in-panel unit GIP1 and the second gate-in-panel unit GIP2 are provided on both sides of the active area AA. The first gate-in-panel unit GIP1 and the second gate-in-panel unit GIP2 may supply the same gate driving voltage signal to both sides of the same first line GL, and prevent increase in load applied to the first lines GL arranged in the large-scale substrate 100, as compared to a structure having a single gate-in-panel unit. As circumstances require, the first gate-in-panel unit GIP1 and the second gate-in-panel unit GIP2 may be connected to the first lines GL such that one gate-in-panel unit supplies a gate driving voltage signal to odd-numbered first lines GL1, GL3, . . . and the other gate-in-panel unit supplies a gate driving voltage signal to even-numbered first lines GL2, GL4, . . . .

As exemplarily shown in FIG. 2, in the display device in accordance with the present disclosure, the first gate-in-panel unit GIP1 and the second gate-in-panel unit GIP2 include a buffer circuit directly connected to the first lines GL according to the stages corresponding to the respective first lines GL, and sequentially output a gate driving voltage signal Vout(n) to the first lines GL. The first gate-in-panel unit GIP1 and the second gate-in-panel unit GIP2 are formed to have circuit configuration in the non-display area in the same process as formation of thin film transistors provided in the active area, and are referred to as embedded gate drivers.

FIG. 2 illustrates the buffer circuit corresponding to an output terminal of the gate-in-panel unit, and the gate-in-panel unit further includes a shift resistor provided at the left side of the buffer circuit to sequentially output the gate driving voltage signal Vout(n) according to a clock signal, in addition to the buffer circuit.

Further, the buffer circuit includes a pull-up transistor PUT and a pull-down transistor PDT arranged in series, with respect to one end of each first line GL(n), the end of the first line GL(n) is connected between the pull-up transistor PUT and the pull-down transistor PDT, and the buffer circuit further includes a storage capacitor Cst connected between one end of the first line GL(n) and a gate electrode of the pull-up transistor PUT.

The storage capacitor Cst in accordance with the present disclosure is configured to provide the gate driving voltage signal Vout(n) applied to the first line (gate line) GL(n) to each subpixel without degradation regardless of a distance from the gate-in-panel unit, corresponding to the large-scale display device, and, in order to secure sufficient capacitance, has an area of at least 100 μm×100 μm. Further, if the storage capacitor Cst in accordance with the present disclosure is formed in a shape to cover the entirety of an allocated storage capacitor area, the capacitance of the storage capacitor Cst in the entire area is not used even if there are electrical foreign substances in a part of the storage capacitor area, and, in order to prevent such a problem, the storage capacitor Cst in accordance with the present disclosure is configured such that a large-scale area is divided into regions, connection parts are provided between the divided regions and respective electrodes are formed, and thus, if electrical foreign substances in a specific divided region are observed, the connection part connected to the divided region in which the foreign substances are observed is cut during a repair process so that the divided region is separated and thereby the storage capacitor Cst in the remaining divided regions may be used.

Further, the storage capacitor Cst in accordance with the present disclosure is directly connected to one end of the first line GL(n), and is provided so as to, when the gate driving voltage signal Vout(n) supplied to the first line GL(n) is transmitted to the first line GL(n), uniformly transmit the gate driving voltage signal Vout(n) to the first line GL(n) regardless of a degree of adjacency of the subpixel to which the gate driving voltage signal from the first gate-in-panel unit GIP1 and the second gate-in-panel unit GIP2 is supplied.

The buffer circuit shown in FIG. 2 illustrates only a part of the gate-in-panel unit, i.e., briefly illustrates a part of the gate-in-panel unit which is directly connected to the first line GL(n).

In the buffer circuit, the pull-up transistor PUT receives a clock signal CLK and outputs high voltage VDD charging a node Q of the shift resistor to the first line GL(n), and the pull-down transistor PDT is turned on by voltage of a node QB of the shift resistor and discharges voltage Vout(n) of the first line GL(n) to the ground as voltage VSS.

In the display device in accordance with the present disclosure, one end of each of the second lines DL is connected to a link line 191 directed to a pad part PAD positioned at one side of the non-display area, a pad electrode (not shown) is provided at the end of the link line 191, and the pad electrode is connected to a data driver IC 180 or a flexible printed circuit board so as to receive a data signal at the pad part PAD.

The first gate-in-panel unit GIP1 and the second gate-in-panel unit GIP2 receive the clock signal CLK and power voltage VDD corresponding to gate driving voltage through a timing controller (not shown) provided in the flexible printed circuit board or a printed circuit board connected to the data driver IC 180.

The buffer circuit shown in FIG. 2 is the most basic example using a single clock signal, and, if a plurality of clock signals relates with application of the illustrated gate driving voltage, plural sets of a pull-up transistor and a pull-down transistor connected in series may be arranged in parallel, and different clock signals may be applied to input terminals of the respective pull-up transistors.

The date driver IC 180 converts aligned image signals (RGB), which are input according to a data control signal input from the timing controller (not shown), into a data signal (Vdata) of an analog type using reference voltage. Further, the data signal (Vdata) is latched for one horizontal period (1H), and is output to all the second lines DL in response to the gate driving voltage signal applied to each first line GL.

Figure 3:
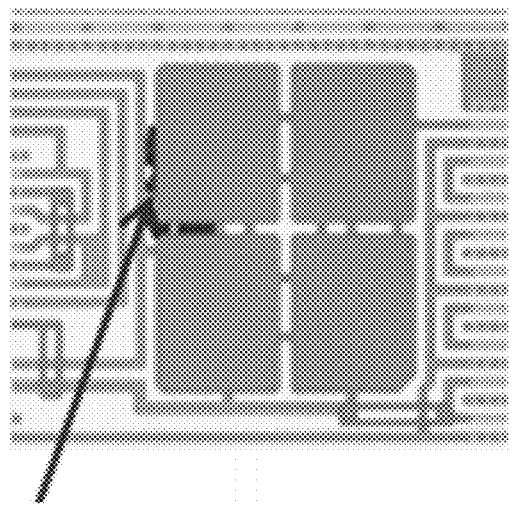
FIG. 3 is a photograph representing a defect generated in a gate-in-panel unit of a display device in accordance with a comparative example.
Figure 4A:
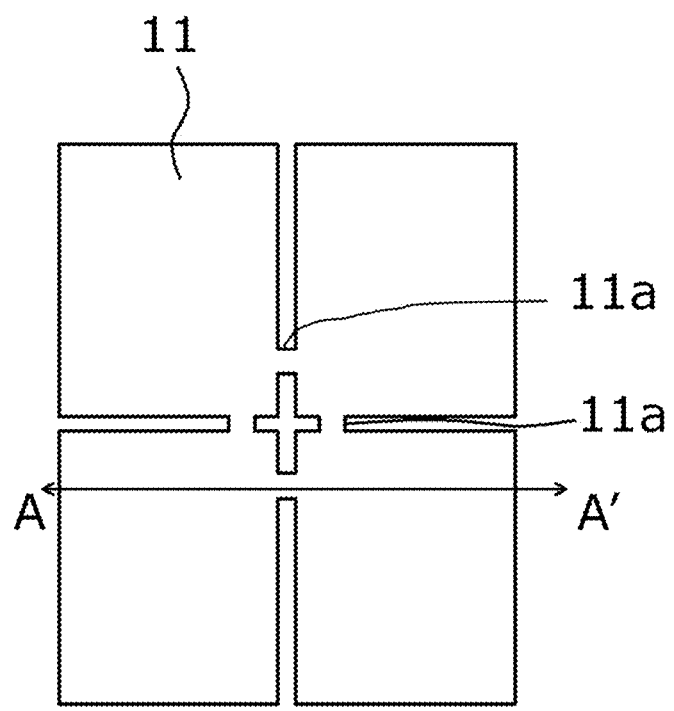
FIGS. 4A and 4B are plan views illustrating a first metal layer and a second metal layer of a storage capacitor in the gate-in-panel unit of the display device in accordance with the comparative example.
Figure 4B:
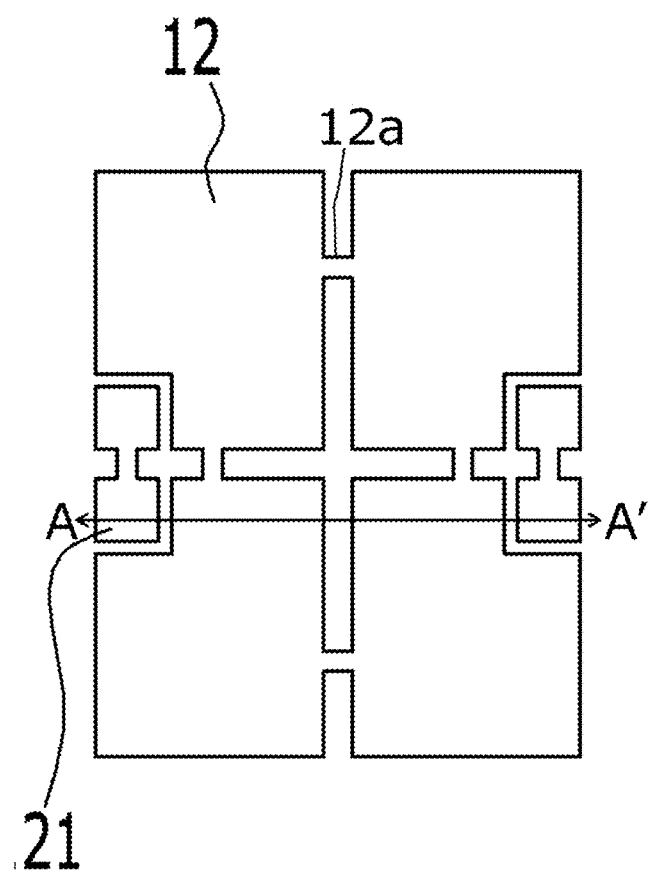

FIG. 3 is a photograph representing a defect generated in a gate-in-panel unit of a display device in accordance with a comparative example, and FIGS. 4A and 4B are plan views of the display device in accordance with the comparative example.

As exemplarily shown in FIG. 3, in a structure of the display device in accordance with the comparative example, in which electrode layers forming a storage capacitor provided in the gate-in-panel unit have connection parts between divided patterns, short occurs at the connection part or at a region between the storage capacitor and a node Q.

It is estimated that, the electrodes are charged with charges by plasma occurring during a dry-etching process carried out when contact holes are formed in an interlayer insulating film between the respective electrode layers of the storage capacitors formed as massive patterns as compared to peripheral wirings, and the charges flow in the massive metal electrodes and cause AC short at the connection part having a small width.

Figure 5:
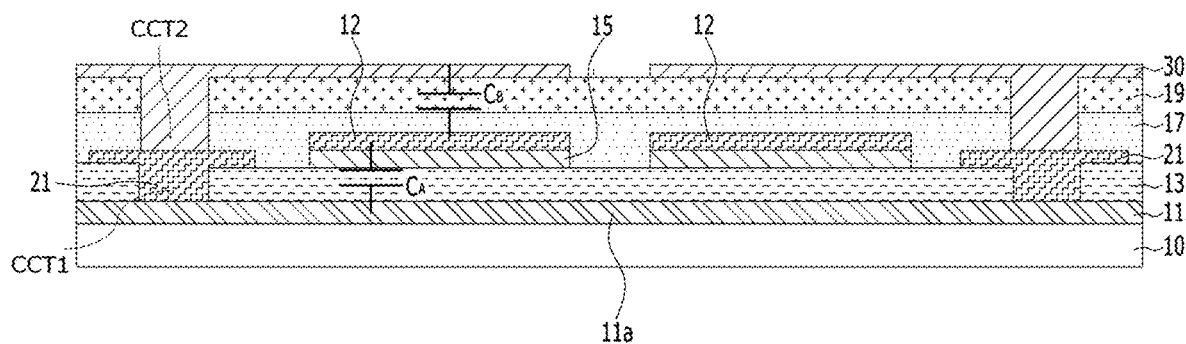
FIG. 5 is a cross-sectional view taken along line A-A' of FIGS. 4A and 4B after completion of formation of the storage capacitor in accordance with an embodiment of the present disclosure.

As exemplarily shown in FIGS. 4A and 4B and FIG. 5, the storage capacitor in accordance with the comparative example includes a first capacitor $C_A$ and a second capacitor $C_B$ connected in parallel.

The first capacitor $C_A$ includes a first metal layer provided on a substrate 10 and having quadrisectional rectangular patterns and first connectors 11a formed integrally with the quadrisectional rectangular patterns to connect two adjacent rectangular patterns out of the quadrisectional rectangular patterns, as exemplarily shown in FIG. 4A, a second metal layer 12 overlapping the metal layer 11 and having quadrisectional rectangular patterns having a smaller area than that of the rectangular patterns of the first metal layer 11 and second connectors 12a formed integrally with the quadrisectional rectangular patterns to be located at different regions from the first connectors 11a, and first contact electrode patterns 21 formed in the same layer as the second metal layer 12 to be spaced apart from the second metal layer 12 and connected to the rectangular patterns of the first metal layer 11 through first contact parts, as exemplarily shown in FIG. 4B.

Here, the first contact parts are provided as contact holes in a buffer layer 13 between the first metal layer 11 and the second metal layer 12.

Further, as exemplarily shown in FIG. 5, the second capacitor $C_B$ includes a transparent electrode pattern 30 connected to the first contact electrode patterns 21 through second contact parts formed through a first interlayer insulating film 17 and a second interlayer insulating film 19 provided on the upper surfaces of the second metal layer 12 and the first contact electrode patterns 21.

In order to connect the first capacitor $C_A$ and the second capacitor $C_B$ in parallel, the first metal layer 11 and the transparent electrode pattern 30 are connected through the a first contact part and a second contact part.

Further, non-described reference numeral 15 indicates a gate insulating film which functions to perform interlayer separation between a semiconductor layer and a gate electrode in a thin film transistor in an active area or a non-display area.

The storage capacitor of the gate-in-panel unit in the display device in accordance with the comparative example, in which the first metal layer 11 and the second metal layer 12 formed to have a massive size of 100 μm×100 μm or more, as compared to peripheral wirings, may secure improved storage capacitance due to a large scale and prevent influence of load of a gate driving voltage signal applied to first lines. However, as described above, the respective metal layers are charged with charges by plasma occurring during the dry-etching process of the insulating film, the charges are moved to the connection parts having a small line width and thus cause short. In order to solve such a problem, the present disclosure provides a storage capacitor having the following configuration.

Figure 6:
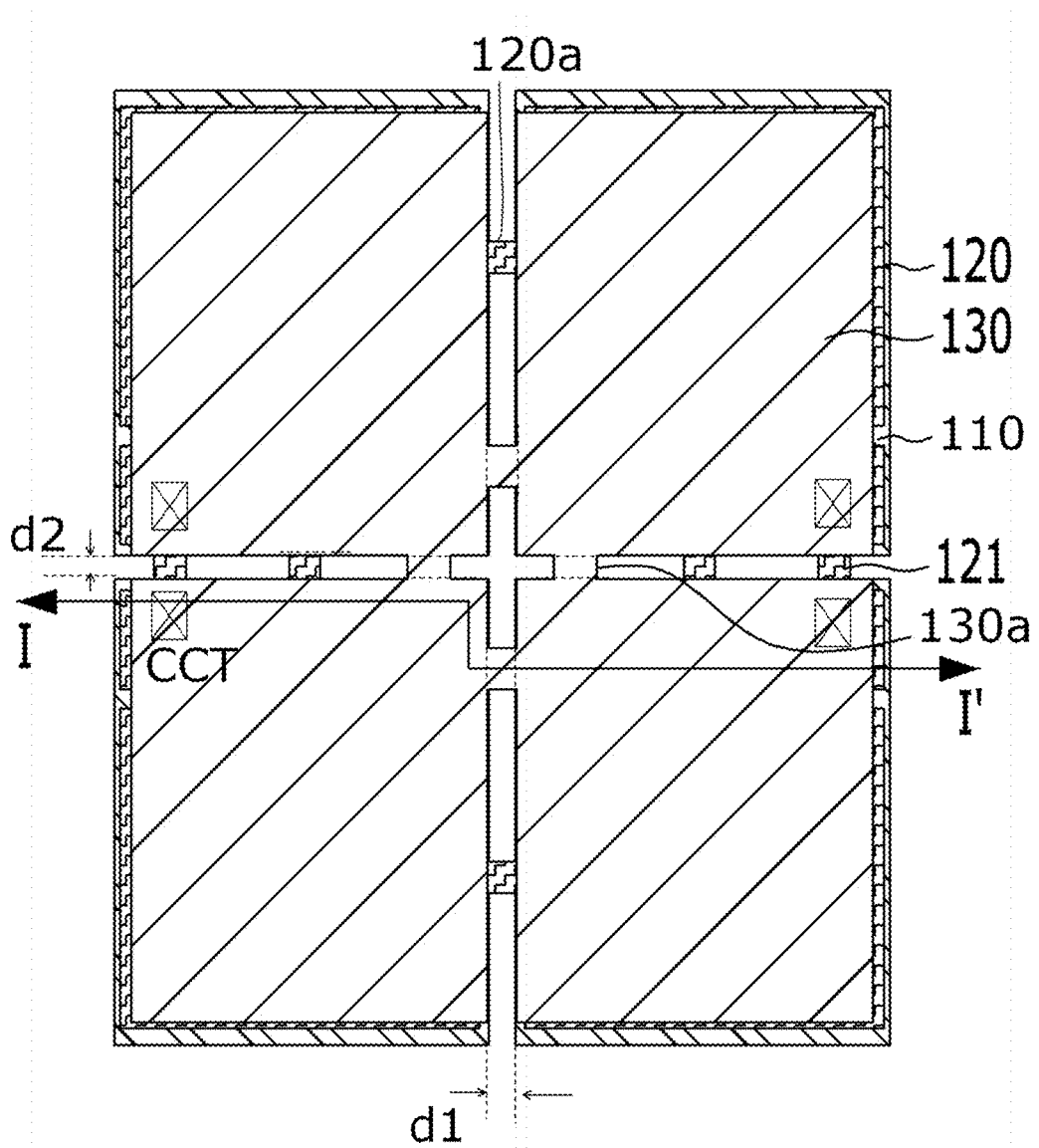
FIG. 6 is a plan view of a storage capacitor in the gate-in-panel unit of the display device in accordance with an embodiment of the present disclosure.
Figure 7:
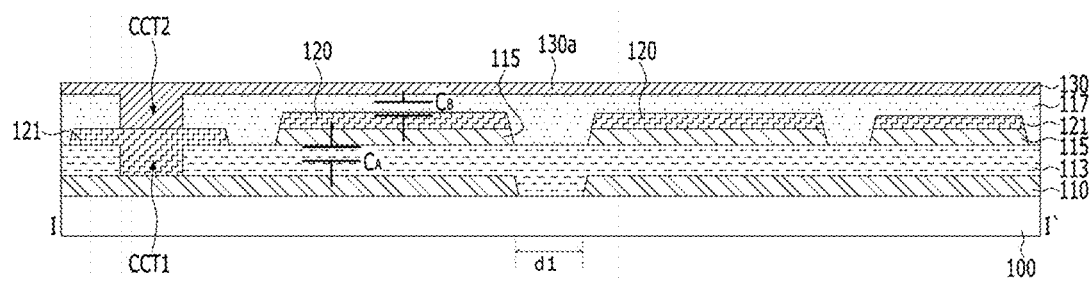
FIG. 7 is a cross-sectional view taken along line I-I' of FIG. 6 in accordance with an embodiment of the present disclosure.

FIG. 6 is a plan view of a storage capacitor in the gate-in-panel unit of the display device in accordance with the present disclosure, and FIG. 7 is a cross-sectional view taken along line I-I' of FIG. 6.

As exemplarily shown in FIGS. 6 and 7, the storage capacitor provided in the gate-in-panel unit of the display device in accordance with the present disclosure includes a plurality of divided metal patterns formed of a first metal layer and spaced apart from one another, a first electrode connection pattern 120 formed of a second metal layer, overlapping the divided metal patterns 110 with a buffer layer 113 interposed therebetween and having first connection parts 120a provided in regions between the divided metal patterns 110, and a transparent electrode connection pattern 130 overlapping the first electrode connection pattern 120 with an interlayer insulating film 117 interposed therebetween, formed of a transparent electrode and having second connection parts 130a provided in regions between the divided metal patterns 110 non-overlapping the first connection parts 120a.

That is, the storage capacitor in accordance with the present disclosure is characterized in that the divided metal patterns 110 formed of the metal layer are completely separated from one another without connection parts.

Such a structure of the storage capacitor solves problems caused by the above-described storage capacitor in accordance with the comparative example, in which the divided patterns of the respective metal layers are partially spaced apart from but are integrally connected by the connection parts and electrostatic charges generated during processes and charging the massive metal layers may flow among the divided patterns of the metal layers. That is, the divided metal patterns 110 are respectively formed in an island type and are thus completely separated from one another, and, even if the respective divided metal patterns 110 are charged with electrostatic charges, transmission of the electrostatic charges to adjacent divided metal patterns 110 is prevented.

In the divided metal patterns 110, a space of a first distance d1 is provided between two adjacent divided metal patterns 110 in different columns and a space of a second distance d2 is provided between two adjacent divided metal patterns 110 in different rows.

The first distance d1 and the second distance d2 may be about 1 µm or more so as to be detectable with resolution of a light exposure apparatus, and be 15 µm or less so as to maximize the capacitance of the storage capacitor in a restricted area. As circumstances require, the first distance d1 and the second distance d2 may be equal.

Further, although FIG. 6 illustrates the divided metal patterns 110 as quadrisectional metal patterns acquired by dividing a single pattern into four parts, the divided metal patterns 110 may be provided as bisectional patterns acquired by dividing a single pattern into two parts, hexapartite patterns acquired by dividing a single pattern into six parts, octisectional patterns acquired by dividing a single pattern into eights parts, or patterns acquired by dividing a single pattern into a greater number of parts, as needed.

Further, the storage capacitor in accordance with the present disclosure is provided as an element of the gate-in-panel unit, but is not limited thereto. That is, the storage capacitor in accordance with the present disclosure may be provided in the active area or be applied to other electronic apparatuses requiring a large-scale storage capacitor in addition to the display device, as long as the storage capacitor has the structure having a plurality of patterns divided from the first metal layer and requiring high capacitance.

Further, the storage capacitor in accordance with the present disclosure further includes first electrode contact patterns 121, which are formed of the second metal layer to be spaced apart from the first electrode connection pattern 120 and overlap at least two adjacent divided metal patterns 110, and the first electrode contact patterns 121 connect the transparent electrode connection pattern 130 having the second connection parts 130a provided on the first electrode contact patterns 121 and the divided metal patterns 110 provided under the first electrode contact patterns 121 so that the upper transparent electrode connection pattern 130 and the lower first metal layer are coupled with the first electrode connection pattern 120 interposed therebetween, and thus connect the first capacitor $C_A$ and the second capacitor $C_B$ in parallel so as to increase the capacitance of the storage capacitor.

Further, the first electrode contact patterns 121 have a small area, and thus, even if some of the divided metal patterns 110 are charged with electrostatic charges during the dry-etching process to pattern the buffer layer 113 or a gate insulting film 115, the divided metal patterns 110 are connected to the first electrode contact patterns 121 having the small area, a flow area of electrostatic charges is reduced and thereby short due to electrostatic charges may be prevented.

Further, in the storage capacitor in accordance with the present disclosure, the transparent electrode connection pattern 130 has the second connection parts 130a having a small line width but is located in the same layer as pixel electrodes of the active area, and, even if the subsequent dry-etching process generating plasma damage is not carried out anymore and thus the first electrode contact patterns 121 and the transparent electrode connection pattern 130 are connected, there are few electrostatic charges in the transparent electrode connection pattern 130 and thus an effect of preventing flow of the electrostatic charges to the island-type divided metal patterns 110 may be maintained.

Further, the first metal layer and the second metal layer forming the divided metal patterns 110 and the first electrode connection pattern 120 of the present disclosure may be respectively formed of a low-resistance metal, for example, one selected from the group comprising copper (Cu), aluminum (Al), molybdenum (Mo), alloys thereof and stacks thereof, without being limited thereto, and be respectively formed of any material which may maintain low resistance.

Further, the transparent electrode connection pattern 130 may be formed of one selected from the group comprising indium tin oxide (ITO), indium zinc oxide (IZO) and indium tin zinc oxide (ITZO), without being limited thereto, and be formed of any metal oxide which may be connected to the first capacitor $C_A$ and thus form an improved storage capacitor through the second capacitor $C_B$ at an overlap region while maintaining transparency.

The transparent electrode connection pattern 130 overlaps the first electrode contact pattern 121, is connected to the first electrode contact pattern 121 through a second contact hole CCT2 provided in the interlayer insulating film 117 at the overlap region therebetween, and thus has the same potential as the divided metal pattern 110 connected to the first electrode contact pattern 121 through the first contact hole CCT1 provided in the lower buffer layer 113.

Each of the first electrode contact patterns 121 passes between at least two adjacent divided metal patterns 110 spaced apart from each other, and thus the first electrode contact patterns 121 conductively connect the divided metal patterns 110 provided as an island type, spaced apart from one another.

The first electrode contact patterns 121 are provided to conductively connect two adjacent divided metal patterns 110, and, besides the first electrode contact patterns 121 arranged in the vertical direction to connect two adjacent divided metal patterns 110 arranged in the vertical direction, as exemplarily shown in FIG. 6, other first electrode contact patterns 121 may be arranged in the horizontal direction to connect two adjacent divided metal patterns 110 arranged in the horizontal direction. Otherwise, both the illustrated first electrode contact patterns 121 arranged in the vertical direction and other first electrode contact patterns 121 arranged in the horizontal direction may be provided. In this case, the first electrode contact patterns 121 are spaced apart from the first electrode connection pattern 120 in the same layer as the first electrode contact patterns 121, and thus are electrically isolated from first electrode connection pattern 120.

The gate insulating film 115 provided under the first electrode connection pattern 120 is not essential and may be omitted in some cases.

Further, the buffer layer 113, the gate insulating film 115 and the interlayer insulating film 117 provided between the respective metal layers in the storage capacitor may be inorganic insulating films having high permittivity in terms of increase in the capacitance of the storage capacitor.

The first connection parts 120a and the second connection parts 130a may be used for laser cutting parts in a repair process.

If the storage capacitor is formed in a shape to cover the entirety of an allocated storage capacitor area, a storage capacitance of the entire area is not used even though there are electrical foreign substances in a part of the area, and, in this case, the storage capacitor formed to have a large scale may not normally function, a sufficient gate driving voltage may not be applied to the gate line connected to the storage capacitor, and thus a line-type defect is observed.

In order to prevent such a problem, the storage capacitor in accordance with the present disclosure is configured such that the first electrode connection pattern 120 and the transparent electrode connection pattern 130 do not completely fill the entirety of the storage capacitor area, spaces, such as the first distances d1 and the second distances d2, are provided in the first electrode connection pattern 120 and the transparent electrode connection pattern 130 similar to the divided metal patterns 110, and the first connection parts 120a and the second connection parts 130a are provided for signal connection in the respective layers.

In a display device using the storage capacitor in accordance with the present disclosure, if abnormality of a specific storage capacitor occurs in a driving test after completion of a thin film transistor array formation process, which one of the plural divided metal patterns 110 overlaps the first electrode connection pattern 120 or the transparent electrode connection pattern 130 where foreign substances are found is judged, and the first connection part 120a adjacent to the first electrode connection pattern 120 or the second connection part 130a adjacent to the transparent electrode connection pattern 130 in the region overlapping the divided metal pattern 110 where the foreign substances are found is cut using a laser on the upper or lower surface of the substrate 100 and, thereby, the region where the foreign substances are found is separated from the storage capacitor which is normally operated.

The display device in accordance with the present disclosure may be applied to any structure requiring a storage capacitor, for example, an organic light emitting diode display device, a quantum dot display device, a liquid crystal display device, an electrophoretic display device, etc.

Hereinafter, an organic light emitting diode display device will be exemplarily described as the display device in accordance with the present disclosure.

Figure 8:
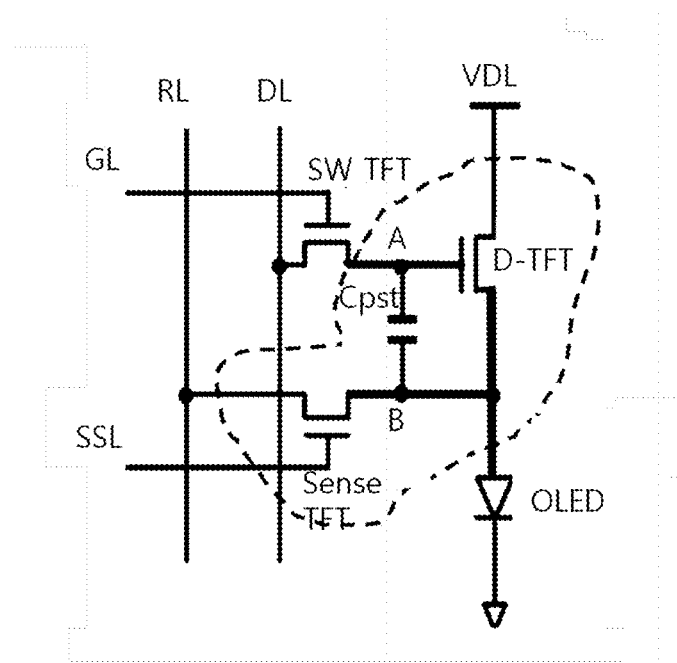
FIG. 8 is a circuit diagram of each subpixel of the display device in accordance with an embodiment of the present disclosure.
Figure 9:
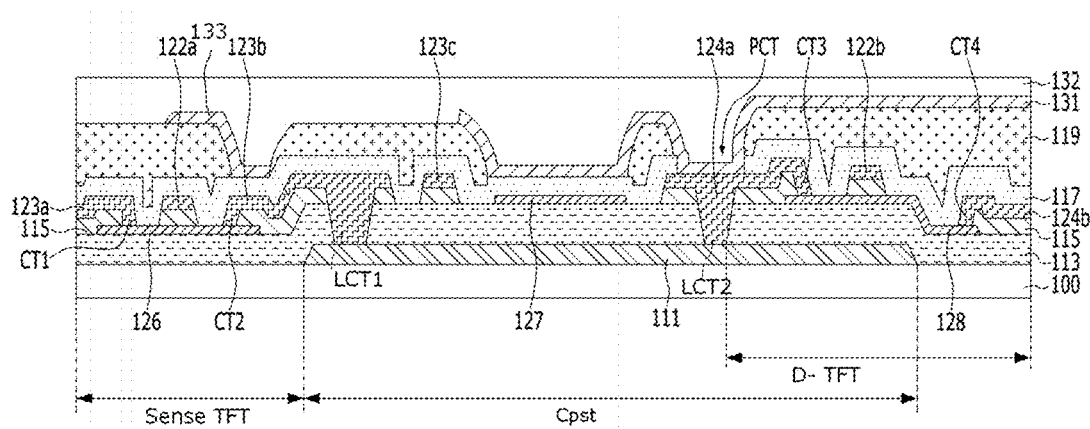
FIG. 9 is a cross-sectional view illustrating the subpixel of the display device in accordance with an embodiment of the present disclosure, shown in FIG. 8.
Figure 10:
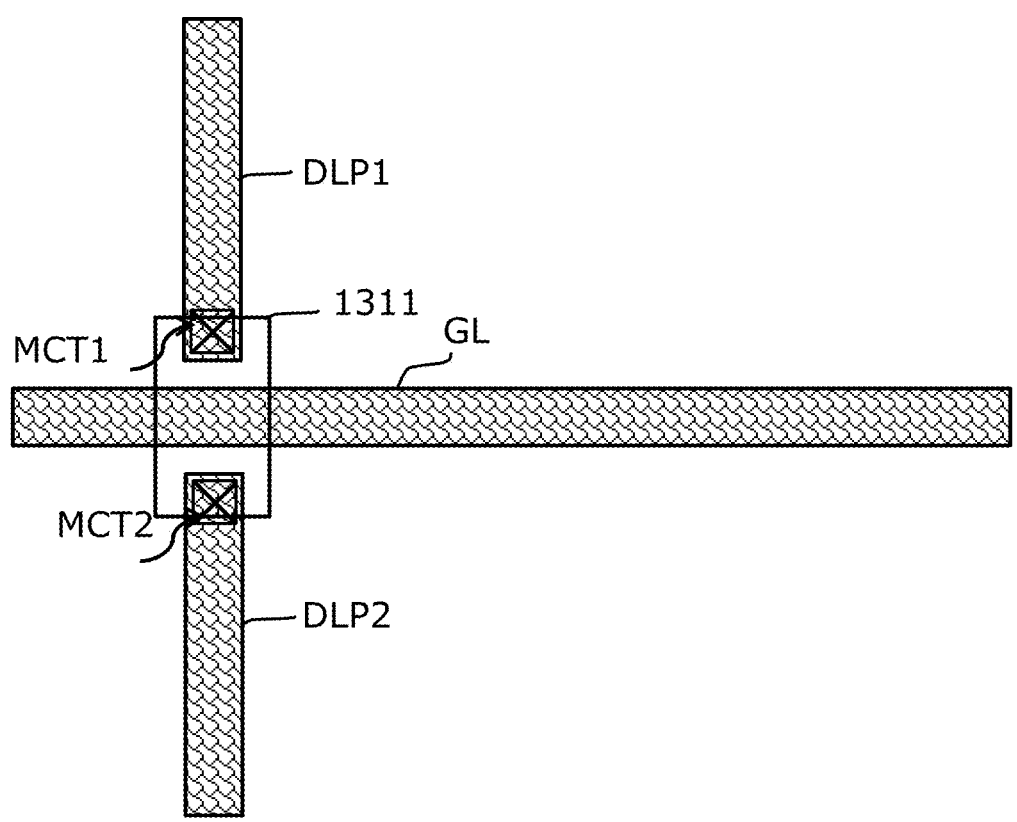
FIG. 10 is a plan view illustrating the configuration of a first line and a second line intersecting each other in the subpixel of the display device in accordance with an embodiment of the present disclosure.

FIG. 8 is a circuit diagram of each subpixel of the display device in accordance with the present disclosure, and FIG. 9 is a cross-sectional view illustrating the subpixel of the display device in accordance with the present disclosure, shown in FIG. 8. FIG. 10 is a plan view illustrating the configuration of a first line and a second line intersecting each other in the subpixel of the display device in accordance with the present disclosure.

Referring to FIG. 8, each subpixel in an active area of the display device in accordance with the present disclosure, implemented as an organic light emitting diode display device, will be described as below.

As exemplarily shown in FIG. 8, the subpixel includes a switching thin film transistor SW TFT provided between a first line GL and a second line DL intersecting each other, a driving thin film transistor D-TFT connected between the switching thin film transistor SW TFT and a power voltage line VDL, a sensing thin film transistor Sense TFT connected between the driving thin film transistor D-TFT and a reference voltage line RL, a pixel storage capacitor Cpst connected between a first node A, which is a connection spot between the switching thin film transistor SW TFT and the driving thin film transistor D-TFT, and a second node B, which is a connection spot between the driving thin film transistor D-TFT and the sensing thin film transistor Sense TFT, and an organic light emitting diode OLED provided between the second node B and a ground terminal. Here, subpixels are defined as regions between first lines GL and second lines DL intersecting each other, and the subpixels are arranged in a matrix on a substrate 100 (in FIG. 1).

A switching drain electrode SD1 of the switching thin film transistor SW TFT and a second gate electrode 122b of the driving thin film transistor D-TFT are connected to the first node A, and a second drain electrode 124a of the driving thin film transistor D-TFF and a first drain electrode 123b of the sensing thin film transistor Sense TFT are connected to the second node B.

Further, a gate electrode (not shown) of the switching thin film transistor SW TFT and a first gate electrode 122a of the sensing thin film transistor Sense TFT are respectively connected to the first line GL and a sensing line SSL.

The switching thin film transistor SW TFT selects a corresponding subpixel to be driven according to a first gate driving voltage signal applied to the first line GL, and the driving thin film transistor D-TFT is connected to the switching thin film transistor SW TFT, controls driving current of the selected subpixel and then supplies the controlled driving current to the organic light emitting diode OLED.

Further, the pixel storage capacitor Cpst maintains voltage supplied from the switching thin film transistor SW TFT for one frame so that the driving thin film transistor D-TFT maintains a constant voltage. For this purpose, the pixel storage capacitor Cpst is located between the second gate electrode 122b and the second drain electrode 124a of the driving thin film transistor D-TFT. Here, the pixel storage capacitor Cpst is connected to the sensing thin film transistor Sense TFT, the sensing thin film transistor Sense TFT supplies initialization voltage (a second gate driving voltage signal) supplied from the reference voltage line RL to the second node B while the sensing thin film transistor Sense TFT is turned on by a sense signal supplied from the sensing line SSL, and this means that initialization is carried out by the sensing signal applied by the sensing line SSL in a specific section.

Referring to FIG. 9, a stack structure of circuit elements in each subpixel will be described.

The sensing thin film transistor Sense TFT includes a first semiconductor layer 126 provided in a designated region on the buffer layer 113 on the substrate 100, and the first gate electrode 122a, a first source electrode 123a and the first drain electrode 123b spaced apart from one another on the same layer on the first semiconductor layer 126. The gate insulating film 115 is provided between the first semiconductor layer 126 and the first gate electrode 122a.

Further, the driving thin film transistor D-TFT includes a second semiconductor layer 128 provided in a designated region on the buffer layer 113 on the substrate 100, and the second gate electrode 122b, the second source electrode 124a and a second drain electrode 124b spaced apart from one another on the same layer on the second semiconductor layer 128.

Further, the pixel storage capacitor Cpst uses a light shielding wiring 111 of the first metal layer, which is first formed on the substrate 100, as a first storage electrode, and uses a third semiconductor layer 127 overlapping the light shielding wiring 111 as a second storage electrode. Connection between the sensing thin film transistor Sense TFT and the driving thin film transistor D-TFT at the second node B is carried out by first connection LCT1 between the light shielding wiring 111 and the first drain electrode 123b and second connection LCT2 between the light shielding wiring 111 and the second drain electrode 124a, and the pixel storage capacitor Cpst implements capacitors, which are respectively provided on and under the third semiconductor layer 127 in parallel, through connection between the second drain electrode 124a of the driving thin film transistor D-TFT and a pixel electrode 131 at a pixel contact hole PCT.

In this case, the third semiconductor layer 127 is a conductive semiconductor layer, and is conductively connected to the second gate electrode 122b of the driving thin film transistor D-TFT.

The first semiconductor layer 126 and the second semiconductor layer 128 and the third semiconductor layer 127 may be respectively formed of one selected from the group comprising amorphous silicon, polysilicon, oxide semiconductor or combinations thereof. Further, the gate insulating film 115 may be provided between the first semiconductor layer 126, the second semiconductor layer 128, and the third semiconductor layer 127 and the first gate electrode 122a and second gate electrode 122b.

In the display device in accordance with the present disclosure, as exemplarily shown in the cross-sectional views, the first gate electrode 122a and the second gate electrode 122b, the first source electrodes 123a and the second source electrode 124b and the first drain electrode 123b and the second drain electrode 124a of the sensing thin film transistor Sense TFT and the driving thin film transistor D-TFT are formed in the same layer and, thus, these electrodes may be formed without steps. Therefore, a separate process to form source/drain electrodes may be omitted and the number of uses of metal layers may be reduced.

For this purpose, the first line GL and the second line DL of the subpixels which intersect each other functionally in the circuit are formed in the same layer as the first gate electrode 122a and the second gate electrode 122b, and, as exemplarily shown in FIG. 10, the first line GL extends in a first direction, the second line DL extending in a direction intersecting the first direction is divided into a first pattern DLP1 and a second pattern DLP2 based on the first line GL such that the first pattern DLP1 and the second pattern DLP2 are spaced apart from the first line GL, and a third pattern 1311 formed of a metal or a transparent electrode in another layer overlaps adjacent portions of the first pattern DLP1 and the second pattern DLP2 to form a first cross connection MCT1 and a second cross connection MCT2. The third pattern 1311 may be formed in the same layer as the light shielding wiring 111 which is first formed on the substrate, or be formed as a transparent electrode connection pattern in the same layer as the pixel electrode 131, and the connection method of the third pattern 1311 may be similar to the connection method shown in FIG. 7. The third pattern 1311 passes the first line GL between the first pattern DLP1 and the second pattern DLP2. Therefore, the display device in accordance with the present disclosure may omit a metal layer of source and drain electrodes through such a cross connection structure, and thus, achieve cost reduction and reduction in the number of uses of metal layers in the active area and thereby prevent lowering of yield during processes, such as light exposure/development, etching, etc. Further, as the number of uses of metal layers is increased, a process margin is increased due to alignment errors between the respective layers and thus an area shielding the active area is increased, and the display device in accordance with the present disclosure may solve such a problem. In another example, the first line may be divided into a first pattern and a second pattern such that the first pattern and the second pattern are spaced apart from the second line.

The interlayer insulating film 117 to cover the first gate electrode 122a and the second gate electrode 122b, the first source electrode 123a and the second source electrode 124b and the first drain electrode 123b and the second drain electrode 124a is provided, and the pixel electrode 131 connected to a designated part of the second drain electrode 124a through the pixel contact hole PCT in the interlayer insulating film 117 is provided.

The pixel electrode 131 extends to a light emitting region, and thus the pixel electrode 131, an organic light emitting layer (not shown) and a common electrode (not shown) stacked thereon form an organic light emitting diode. In the organic light emitting diode, the pixel electrode 131 may be referred to as an anode, and the common electrode may be referred to as a cathode.

The light emitting region is defined by an opening of a bank 132, and the light emitting region is a region which transmits light emitted by the organic light emitting diode. Further, in order to compensate for steps of the insulating films and the metal layers, which are provided up to the interlayer insulating film 117, a planarization film 119 is provided on the interlayer insulating film 117 and under the pixel electrode 131 in the active area AA. The planarization film 119 may be formed as an organic film having high permittivity. Since an insulating film may reduce capacitance of the pixel storage capacitor Cpst, the planarization film 119 is not provided in the overlap region between the first storage electrode 111 and the third semiconductor layer 127. As circumstances require, the third semiconductor layer 127 and the pixel electrode 131 may be directly connected. Similarly, in the storage capacitor Cst in the gate-in-panel unit shown in FIG. 7, the insulating films provided between the respective metal layers may be provided as only inorganic films having low permittivity.

A gate metal layer 123c may be formed integrally with the first drain electrode 123b and the second drain electrode 124a.

Although not shown in this cross-sectional view, the second gate electrode 122b of the driving thin film transistor D-TFT may be conductively connected to the first drain electrode 123b, as exemplarily shown in FIG. 8.

Further, non-described reference marks CT1 to CT4 mean contact holes formed in the interlayer insulating film 115 between both ends of the first semiconductor layer 126 and the first source electrode 123a and first drain electrode 123b, and contact holes formed in the interlayer insulating film 115 between both ends of the second semiconductor layer 128 and the second source electrode 124b and second drain electrode and 124a.

Further, non-described reference numeral 133 is a pixel electrode island-type pattern formed in the same layer as the pixel electrode 131 and used in a repair process when abnormality in the sub-pixel is detected.

Hereinafter, the storage capacitor, the display device using the same and a method for manufacturing the same in accordance with the present disclosure will be described with reference to the following drawings.

Figure 11A:
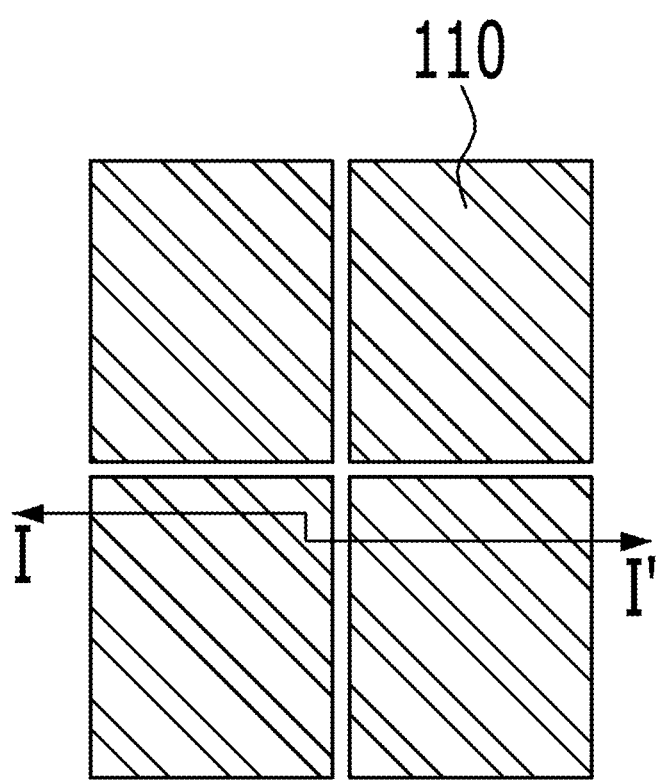
Figure 11B:
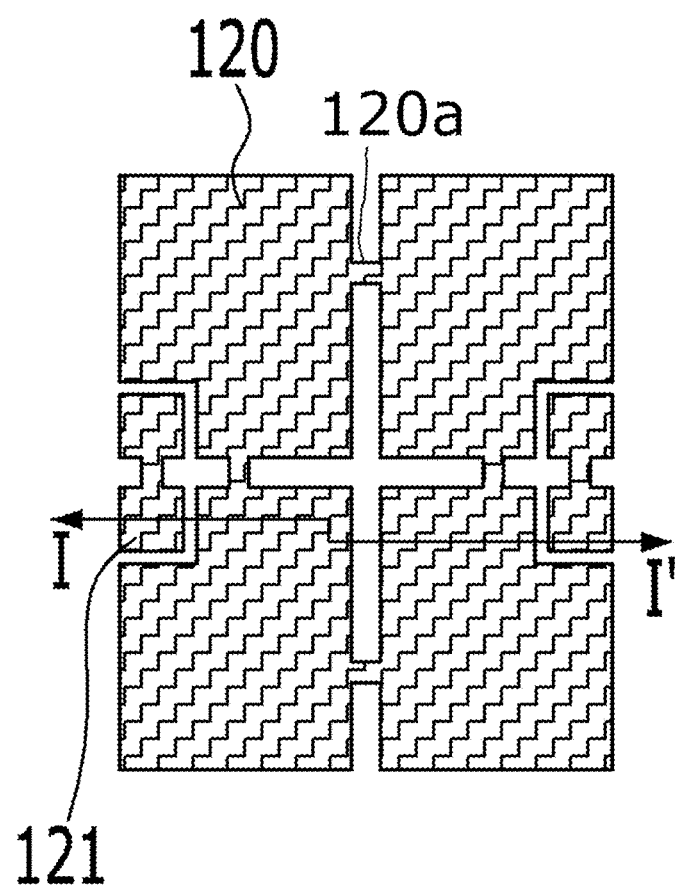
Figure 12A:
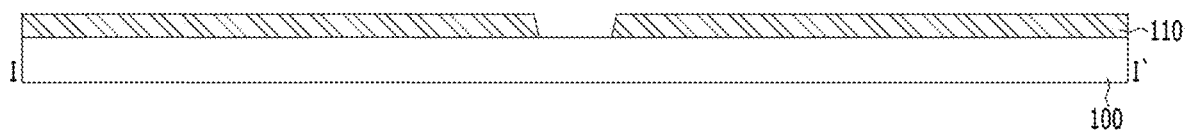
FIGS. 12A to 12C are cross-sectional views illustrating the manufacturing method of FIGS. 11A to 11C in accordance with an embodiment of the present disclosure.
Figure 12B:
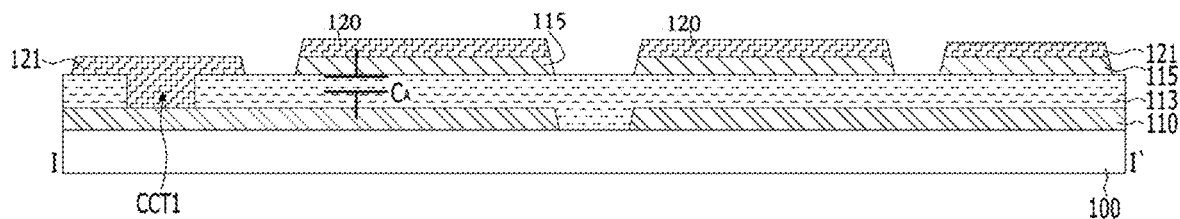
Figure 12C:
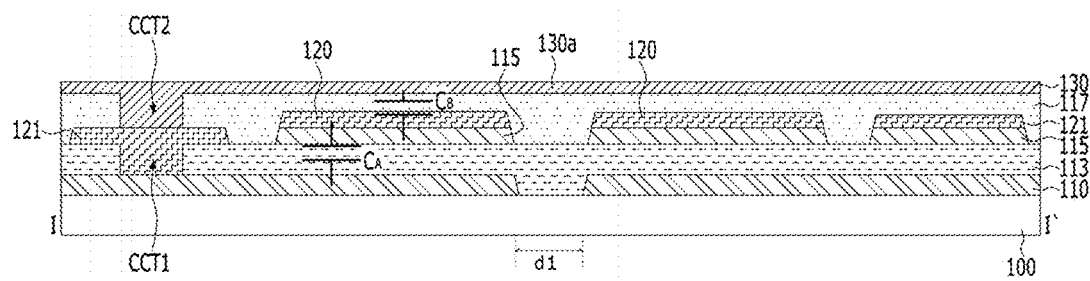

FIGS. 11A to 11C are plan views illustrating a method for manufacturing the display device comprising a storage capacitor in accordance with the present disclosure, and FIGS. 12A to 12C are cross-sectional views illustrating the manufacturing method of FIGS. 11A to 11C.

In the manufacturing method in accordance with the present disclosure, the substrate 100 having an active area having a plurality of subpixels provided therein and a non-display area outside the active area is first prepared.

As exemplarily shown in FIGS. 11A and 12A, a plurality of divided metal patterns 110 formed of the first metal layer and spaced apart from one another is formed on at least one side of the non-display area. In the same operation, the light shielding wiring 111 is formed in the active area as shown in FIG. 9.

Thereafter, the buffer layer 113 having the first contact holes CCT1 to expose parts of at least two adjacent divided metal patterns 110 in the non-display area is formed on the substrate 100.

Thereafter, as exemplarily shown in FIG. 9, in the active area AA, the first semiconductor layer 126, the second semiconductor layer 128, and the third semiconductor layer 127 are formed in regions for the sensing thin film transistor Sense TFT, the driving thin film transistor D-TFT and the pixel storage capacitor Cpst.

Thereafter, as exemplarily shown in FIGS. 11B and 12B, the gate insulating film 115 is formed to cover the first to third semiconductor layers 126, 128 and 127, and the first semiconductor layer contact hole CT1 and the second semiconductor layer contact hole CT2 and the third semiconductor layer contact hole CT3 and the fourth semiconductor layer contact hole CT4 to expose both ends of the first semiconductor layer 126 and the second semiconductor layer 128 are formed by patterning the gate insulating film 115. During such a process, the island-type gate insulating film 115 remains on a designated region of each of the first semiconductor layer 126 and the second semiconductor layer 128. A part of the gate insulting film 115 may remain in the non-active area.

Thereafter, by depositing the second metal layer on the buffer layer 113 and the gate insulting film 115 and selectively removing the second metal layer, the first electrode contact patterns 121 to connect two adjacent divided metal patterns 110 through the first contact holes CCT1, and the first electrode connection pattern 120 spaced apart from the first electrode contact patterns 121, overlapping the divided metal patterns 110 and having the first connection parts 120a provided in regions between the divided metal patterns 110 are formed. In the same process, in the active area, by selectively removing the second metal layer, the first gate electrode 122a and the first source electrode 123a and the drain electrode 123b spaced apart from both sides thereof and connected to both ends of the first semiconductor layer 126 are formed on the island-type gate insulting film 115 in the region for the sensing thin film transistor Sense TFT, and the second gate electrode 122b and the second source and drain electrodes 124b and 124a spaced apart from both sides thereof and connected to both ends of the second semiconductor layer 128 are formed on the island-type gate insulating film 115 in the region for the driving thin film transistor D-TFT.

A switching thin film transistor SW TFT may be formed in the same process of the sense thin film transistor Sense TFT and the driving thin film transistor D-TFT.

Thereafter, as exemplarily shown in FIGS. 11C and 12C, the interlayer insulting film 117 having the second contact holes CCT2 overlapping the first electrode contact patterns 121 is formed.

Thereafter, the planarization film 119 is formed on the interlayer insulating film 117.

Thereafter, by selectively removing the planarization film 119 and the interlayer insulating film 117, the planarization film 119 is removed from the non-display area, and the second contact hole CCT2 to expose a part of the upper surface of the first electrode contact pattern 121 is formed. In the same process, in the active area, the pixel contact hole PCT is formed to expose the second drain electrode 124a by removing the planarization film 119 and the interlayer insulating film 117. Here, the planarization film 119 or both the planarization film 119 and the interlayer insulating film 117 may be removed from the upper surface of the third semiconductor layer 127 of the pixel storage capacitor Cpst.

Thereafter, by depositing a transparent metal and then selectively removing the transparent metal, the transparent electrode connection pattern 130 connected to the first electrode contact patterns 121 through the second contact holes CCT2, having the second connection parts 130a provided in regions between the divided metal patterns 110 non-overlapping the first connection parts 120a, and overlapping the divided metal patterns 110 is formed. In the same process, the pixel electrode 131 may be formed in each subpixel in the active area.

Thereafter, as exemplarily shown in FIG. 9, the bank 132 is formed in regions except for light emitting regions of the respective subpixels. If the display device is a bottom emission type, elements of the pixel circuit include a light shielding wiring and these elements are shielded by the bank 132, and, if the display device is a top emission type, the pixel electrode (the anode) includes a reflective metal and may shield elements of the pixel circuit, and thus the width of openings of the bank 132 of the top emission-type display device may be greater than the width of openings of the bank 132 of the bottom emission-type display device.

Thereafter, an organic light emitting layer (not shown) and a common electrode (not shown) are formed. The organic light emitting layer may be a single organic light emitting layer, or, in order to increase luminous efficacy due to improvement of recombination between holes and electrons in the organic light emitting layer, a hole transport-related layer may be further provided on the lower surface of the organic light emitting layer and an electron transport-related layer may be further provided on the upper surface of the organic light emitting layer.

In the storage capacitor, the display device using the same and the method for manufacturing the same in accordance with the present disclosure, the first electrode of the storage capacitor, which is located at the lowermost position and is formed of the first metal layer influenced by the etching process of the upper insulating film, is formed as island-type divided metal patterns.

Thereby, even if electrostatic charges remain in the divided metal patterns by plasma occurring during the etching process of the insulating film, flow of the electrostatic charges in the storage capacitor may be prevented by direct contact between the divided metal patterns and the electrode contact patterns having a small area provided thereon. Further, even if the divided metal patterns are connected to the transparent electrode connection pattern provided thereon, factors causing electrostatic charges in a patterning process to form the transparent electrode connection pattern and subsequent processes are few, as compared to a patterning process of the metal layer or the dry-etching process of the insulating film, and thus an integrated first electrode of the storage capacitor may be implemented through connection parts provided in the transparent electrode connection pattern. Therefore, the storage capacitor may maintain a greater area than that of the island-type divided metal patterns and thus have high capacitance.

Further, the large-scale storage capacitor in accordance with the present disclosure may have improved reliability, and, even if a defective region having foreign substances is detected, the defective region may be removed by cutting the corresponding connection part of the second metal layer or the transparent metal layer provided between the divided metal patterns in the repair process, and thus the remaining regions may maintain storage capacitor characteristics.

The large-scale storage capacitor in accordance with the present disclosure may have improved reliability, and thus prevent lowering of luminance in a specific line, thereby preventing poor visibility of the display device.

As apparent from the above description, a storage capacitor, a display device using the same and a method for manufacturing the same in accordance with the present disclosure have effects as follows.

In the storage capacitor, the display device using the same and the method for manufacturing the same in accordance with the present disclosure, a first electrode of the storage capacitor, which is located at the lowermost position and is formed of a first metal layer influenced by the etching process of an upper insulating film, is formed as island-type divided metal patterns.

Thereby, even if electrostatic charges remain in the divided metal patterns by plasma occurring during the etching process of the insulating film, flow of the electrostatic charges in the storage capacitor may be prevented by direct contact between the divided metal patterns and electrode contact patterns having a small area provided thereon. Further, even if the divided metal patterns are connected to a transparent electrode connection pattern provided thereon, factors causing electrostatic charges in a patterning process to form the transparent electrode connection pattern and subsequent processes are few, as compared to a patterning process of the metal layer or the dry-etching process of the insulating film, and thus an integrated first electrode of the storage capacitor may be implemented through connection parts provided in the transparent electrode connection pattern. Therefore, the storage capacitor may maintain a greater area than that of the island-type divided metal patterns and thus have high capacitance.

Further, the large-scale storage capacitor in accordance with the present disclosure may have improved reliability, and, even if a defective region having foreign substances is detected, the defective region may be removed by cutting a corresponding connection part of a second metal layer or a transparent metal layer provided between the divided metal patterns in a repair process, and thus the remaining regions may maintain storage capacitor characteristics.

The large-scale storage capacitor in accordance with the present disclosure may have improved reliability, and thus prevent lowering of luminance in a specific line, thereby preventing poor visibility of the display device.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A storage capacitor comprising:
    a plurality of divided metal patterns formed of a first metal layer on a substrate and spaced apart from one another;
    a first electrode connection pattern formed of a second metal layer, the first electrode connection pattern comprising first regions configured to overlap the plurality of divided metal patterns with a buffer layer interposed therebetween and first connection parts which connect the first regions, the first connection parts overlapping areas between the divided metal patterns; and
    a transparent electrode connection pattern comprising second regions configured to overlap the first electrode connection pattern with an interlayer insulating film interposed therebetween and second connection parts which connect the second regions, the transparent electrode connection pattern formed of a transparent electrode, the second connection parts overlapping areas between the divided metal patterns and non-overlapping the first connection parts.

2. The storage capacitor according to claim 1, further comprising first electrode contact patterns formed of the second metal layer to be spaced apart from the first electrode connection pattern, each of the first electrode contact patterns configured to overlap at least two adjacent divided metal patterns.

3. The storage capacitor according to claim 2, wherein the transparent electrode connection pattern overlaps the first electrode contact patterns.

4. The storage capacitor according to claim 2, wherein the first electrode contact patterns pass between the at least two adjacent divided metal patterns.

5. The storage capacitor according to claim 1, wherein at least one of the first connection parts and the second connection parts are used for laser cutting parts in a repair process.

6. The storage capacitor according to claim 4, wherein a divided metal pattern of the at least two adjacent divided metal patterns is connected to the first electrode contact patterns.

7. The storage capacitor according to claim 6, wherein the transparent electrode connection pattern is connected to the first electrode contact patterns.

8. A display device comprising:
    a substrate having an active area having a plurality of subpixels provided therein and a non-display area outside the active area;
    a plurality of first lines and a plurality of second lines provided in the active area to intersect each other; and
    a storage capacitor comprising:
        a plurality of divided metal patterns formed of a first metal layer, the plurality of divided metal patterns provided on at least one side of the non-display area to be respectively conductively connected to the plurality of first lines and spaced apart from one another,
        a first electrode connection pattern formed of a second metal layer, the first electrode connection pattern comprising first regions configured to overlap the plurality of divided metal patterns with a buffer layer interposed therebetween and first connection parts which connect the first regions, the first connection parts overlapping areas between the divided metal patterns, and
        a transparent electrode connection pattern comprising second regions configured to overlap the first electrode connection pattern with an interlayer insulating film interposed therebetween and second connection parts which connect the second regions, the transparent electrode connection pattern formed of a transparent electrode, the second connection parts overlapping areas between the divided metal patterns and non-overlapping the first connection parts.

9. The display device according to claim 8, further comprising a pull-up transistor and a pull-down transistor arranged in series at one end of each of the plurality of first lines, on the at least one side of the non-display area,
wherein the end of each of the plurality of first lines is connected between the pull-up transistor and the pull-down transistor, and
wherein the storage capacitor is connected to a gate electrode of the pull-up transistor and the end of each of the plurality of first lines.

10. The display device according to claim 8, further comprising first electrode contact patterns formed of the second metal layer to be spaced apart from the first electrode connection pattern, the first electrode contact patterns configured to overlap at least two adjacent divided metal patterns.

11. The display device according to claim 10, wherein the transparent electrode connection pattern overlaps the first electrode contact patterns.

12. The display device according to claim 10, wherein the first electrode contact patterns pass between the at least two adjacent divided metal patterns.

13. The display device according to claim 8, wherein at least one of the first connection parts and the second connection parts are used for laser cutting parts in a repair process.

14. The display device according to claim 8, further comprising, in each of the plurality of subpixels in the active area:
a light shielding wiring in a same layer as the plurality of the divided metal patterns formed of the first metal layer;
at least a pixel thin film transistor having a gate electrode, a source electrode, and a drain electrode in a same layer as the first electrode connection pattern formed of the second metal layer; and
a pixel electrode formed in a same layer as the transparent electrode connection pattern.

15. The display device according to claim 14, further comprising an organic light emitting layer and a common electrode sequentially stacked on the pixel electrode, in each of the plurality of subpixels in the active area.

16. The display device according to claim 8, wherein the plurality of first lines and the plurality of second lines are formed in a same layer as the second metal layer.

17. The display device according to claim 16, wherein one of the first line and the second line in each subpixel is divided into a first pattern and a second pattern such that the first pattern and the second pattern are spaced apart from the other of the first line and the second line.

18. The display device according to claim 17, further comprising a third pattern formed of the first metal layer or the transparent electrode, the third pattern configured to overlap and connect adjacent portions of the first pattern and the second pattern.

* * * * *